United States Patent [19]
Gardner et al.

[11] Patent Number: 5,801,088
[45] Date of Patent: Sep. 1, 1998

[54] METHOD OF FORMING A GATE ELECTRODE FOR AN IGFET

[75] Inventors: Mark I. Gardner, Cedar Creek; Derick J. Wristers; H. Jim Fulford, Jr., both of Austin, all of Tex.

[73] Assignee: Advanced Micro Devices, Inc., Sunnyvale, Calif.

[21] Appl. No.: 682,233

[22] Filed: Jul. 17, 1996

[51] Int. Cl.⁶ .................................................. H01L 21/28
[52] U.S. Cl. ........................................ 438/585; 438/947
[58] Field of Search .................................. 438/585, 947, 438/301, 700, 702, 720, 780, 177, 193, 346, 347, 389

[56] References Cited

U.S. PATENT DOCUMENTS

| | | | |
|---|---|---|---|
| 4,037,307 | 7/1977 | Smith | 438/585 |
| 4,312,680 | 1/1982 | Hunter | 438/947 |
| 4,313,782 | 2/1982 | Sokoloski | 438/947 |
| 4,354,896 | 10/1982 | Hunter et al. | 438/947 |
| 4,358,340 | 11/1982 | Fu | 438/947 |
| 4,419,809 | 12/1983 | Riseman et al. | 438/947 |
| 4,430,791 | 2/1984 | Dockerty | 438/947 |
| 4,440,493 | 4/1984 | Hiraga | 355/86 |
| 4,460,435 | 7/1984 | Maa | 438/947 |
| 4,631,113 | 12/1986 | Donald | 438/301 |
| 4,737,828 | 4/1988 | Brown | 438/585 |
| 5,202,272 | 4/1993 | Hsieh et al. | 438/947 |
| 5,397,715 | 3/1995 | Miller | 437/27 |
| 5,532,114 | 7/1996 | Bae | 430/312 |

FOREIGN PATENT DOCUMENTS 63-133722  6/1987  Japan ................... 438/193

OTHER PUBLICATIONS

M. Ono et al., "A 40 nm Gate Length n–MOSFET," IEEE Transactions on Electron Devices, vol. 42, No. 10, (1995), pp. 1822–1830.

*Primary Examiner*—Mary Wilczewski
*Attorney, Agent, or Firm*—Skjerven, Morrill, MacPherson, Franklin & Friel, LLP; David M. Sigmond

[57] ABSTRACT

A method of forming a gate electrode for an insulated-gate field-effect transistor (IGFET) is disclosed. The method includes forming a gate material for providing a gate electrode over a semiconductor substrate, forming a first mask over the gate material wherein the first mask includes an opening that defines a first edge of the gate electrode, removing a first portion of the gate material to form the first edge of the gate electrode as defined by the first mask, forming a second mask over the gate material after removing the first mask wherein the second mask includes an opening that defines a second edge of the gate electrode, removing a second portion of the gate material to form the second edge of the gate electrode as defined by the second mask, and removing the second mask. Thus, the gate electrode is defined by a lateral displacement between the openings in the first and second masks. Preferably, the first and second masks are photoresist, and the length between the first and second edges of the gate electrode is less than the minimum resolution of a photolithographic system used to pattern the masks.

41 Claims, 5 Drawing Sheets

METHOD OF FORMING A GATE ELECTRODE FOR AN IGFET

BACKGROUND OF THE INVENTION

1. Field of the Invention

The present invention relates to integrated circuit manufacturing, and more particularly to forming a gate electrode for an insulated-gate field-effect transistor.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the source and drain being doped oppositely to the substrate. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate electrode and the source and drain.

Polysilicon (also called polycrystalline silicon, poly-Si or poly) thin films have many important uses in IGFET technology. One of the key innovations is the use of heavily doped polysilicon in place of aluminum as the gate electrode. Since polysilicon has the same high melting point as a silicon substrate, typically a blanket polysilicon layer is deposited prior to source and drain formation, the polysilicon is anisotropically etched through openings in a photoresist mask to provide a gate electrode which provides a mask during formation of the source and drain by ion implantation, and then the implanted dopant is driven-in and activated using a high-temperature anneal that would otherwise melt the aluminum. Thereafter, an oxide layer is formed over the device, contact windows are etched in the oxide layer to expose the gate electrode, source and drain, a blanket layer of metallization is deposited over the oxide layer and into the contact windows to provide electrical contacts, and selected regions of the metallization are removed.

Photolithography is frequently used to create patterns in the photoresist mask that define the gate electrode. Typically, the wafer is cleaned and prebaked to drive off moisture and promote adhesion, an adhesion promoter is deposited on the wafer, a few drops of photoresist are deposited onto the spinning wafer to provide a uniform layer, the wafer is soft baked to drive off remaining solvents, the wafer is put into a photolithographic system and exposed to a radiation pattern, and then the photoresist is developed. Positive photoresist, in which the developer removes the irradiated regions, is usually used. The photoresist is further hard baked to improve its resistance, and then the wafer is subjected to an additive process (such as ion implantation) or a subtractive process (such as etching) using the photoresist as a mask. Thereafter, the photoresist is stripped.

Photolithographic systems often use a radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer.

The three major methods of optically transferring a pattern on a mask or reticle to a photoresist-coated wafer include contact printing, proximity printing, and projection printing. In contact printing, the mask is clamped against a photoresist-coated wafer. Although this optimizes image transfer and resolution, the contacting process results in mask defects. In proximity printing, the mask and photoresist are spaced by a small distance. Although this overcomes the defect problems associated with contact printing, it also requires extremely flat wafers and masks. In projection printing, lens elements or mirrors are used to focus the mask or reticle image on the photoresist, which is spaced from the mask or reticle by a large distance. Several projection printing techniques have been developed, including projection scanners and step and repeat systems. Projection scanners use a reflective spherical mirror to project the mask onto the wafer by scanning the wafer and the mask with a narrow arc of radiation. Step and repeat systems (steppers) project an image only onto a portion of the wafer. Multiple images of the reticle pattern are stepped and repeated over the entire wafer using multiple exposures. The reticle pattern is typically 2× to 20× the size of the image on the wafer due to reduction by the lens. However, non-reduction (1×) steppers offer a larger field, thereby allowing more than one pattern to be printed at each exposure.

Step and repeat systems often use a mercury-vapor lamp as the illumination source. In mercury-vapor lamps, a discharge arc of high-pressure mercury vapor emits a characteristic spectrum that contains several sharp lines in the ultraviolet region—the I-line (365 nm), the H-line (405 nm) and the G-line (436 nm). Step and repeat systems are designed, for instance, to operate using the G-line, the I-line, a combination of the lines, or at deep UV (240 nm). To obtain the proper projection, high power mercury-vapor lamps are used that draw 200 to 1,000 watts and provide ultraviolet intensity on the order of 100 milliwatts/$cm^2$. In some systems, air jets cool the lamp, and the heated air is removed by an exhaust fan. The reticle is typically composed of glass with relatively defect-free surfaces and a high optical transmission at the radiation wavelength. Popular reticle glasses include soda-lime glass, borosilicate glass, and quartz. Quartz has a low thermal expansion coefficient and high transmission for near and deep ultraviolet light. Although quartz tends to be expensive, it has become more affordable with the development of high quality synthetic quartz material.

In general, the term "resolution" describes the ability of an optical system to distinguish closely spaced objects. The minimum resolution of a photolithographic system is the dimension of minimum linewidth or space that the machine can adequately print or resolve. While optical photolithography continues to be the dominant technology because it is well established and is capable of implementing sub-micron resolution at least as low as 0.35 microns using current equipment, as feature sizes approach 0.5 microns and below, and these features extend across wafer areas of a square inch and more, extensive efforts are being directed at developing alternative technologies. Electron-beam, ion-beam, and x-ray technologies have demonstrated patterning capabilities that extend beyond the limits of optical systems. Electron-beams and ion-beams can also directly write image patterns onto the photoresist without the use of a mask or reticle, for instance by using a controlled stage to position the wafer beneath the tool. However, these alternative approaches have certain drawbacks. For instance, electron-beam lithography has low throughput, x-ray lithography has difficulties with fabricating suitable masks, and ion-beam lithography has low throughput and difficulties with obtaining reliable ion sources.

Thus, workers in the art recognize that there are obvious incentives for trying to push the currently dominant technology (optical photolithography) into the fine-line region. Such an effort, if successful, has the potential for significantly better patterning capabilities.

Accordingly, a need exists for improvements in semiconductor processing techniques employing optical photolithographic systems in order to pattern gate electrodes with dimensions of 0.5 microns and below.

SUMMARY OF THE INVENTION

The invention addresses the forementioned need by providing an improved method of forming a gate electrode for an IGFET. The method includes forming a gate material for providing a gate electrode over a semiconductor substrate, forming a first mask over the gate material wherein the first mask includes an opening that defines a first edge of the gate electrode, removing a first portion of the gate material to form the first edge of the gate electrode as defined by the first mask, forming a second mask over the gate material after removing the first mask wherein the second mask includes an opening that defines a second edge of the gate electrode, removing a second portion of the gate material to form the second edge of the gate electrode as defined by the second mask, and removing the second mask. The gate electrode is defined by a lateral displacement between the openings in the first and second masks. As a result, the length between the first and second edges of the gate electrode is not limited by the minimum resolution of a photolithographic system.

In a first embodiment of the invention, the method includes forming the first mask on the gate material and etching the first portion of the gate material through the opening in the first mask, removing the first mask, and then forming the second mask on the gate material and etching the second portion of the gate material through the opening in the second mask. In this manner, the first and second edges of the gate electrode are formed in sequence.

In a second embodiment of the invention, the method includes forming a masking material for providing a masking region on the gate material, forming the first mask on the masking material, etching a first portion of the masking material through the opening in the first mask to form a first edge of the masking region, removing the first mask, forming the second mask on the masking material, etching a second portion of the masking material through the opening in the second mask to form a second edge of the masking region, removing the second mask, and then etching the gate material using the masking region as an etch mask to form the first and second edges of the gate electrode. In this manner, the first and second edges of the gate electrode are formed simultaneously.

Preferably, the first and second masks are photoresist, the gate material is polysilicon, and the masking material (if any) is silicon dioxide. Advantageously, the gate electrode can have an extremely narrow length. For instance, the maximum length between the first and second edges of the gate electrode can be less than about 1000 angstroms (0.1 microns), which is far less than the minimum resolution of currently available photolithographic systems.

These and other aspects of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

FIGS. 1A–1G show cross-sectional views of successive process steps for forming a gate electrode for an IGFET in accordance with a first embodiment of the invention.

Figure 1A:
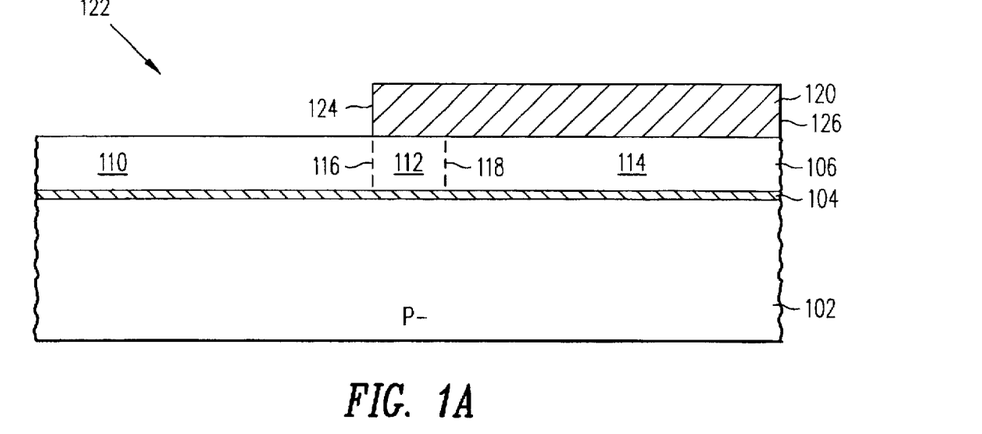
FIGS. 1A–1G show cross-sectional views of successive process steps for forming a gate electrode for an IGFET in accordance with a first embodiment of the invention.

In FIG. 1A, silicon substrate 102 includes an 8 micron thick P-type epitaxial surface layer with a <100> orientation and a resistivity of 12 ohm-cm. Preferably, the epitaxial surface layer is disposed on a P+ base layer (not shown). Substrate 102 is suitable for integrated circuit manufacture. A blanket layer of gate oxide 104, composed of silicon dioxide, is formed on the top surface of substrate 102 using tube growth at a temperature of 700° to 1000° C. in an $O_2$ ambient. Gate oxide 104 has a thickness in the range of 30 to 150 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before being etched by implanting arsenic with a dosage in the range of $1\times10^{15}$ to $5\times10^{15}$ atoms/cm$^2$ and an energy in the range of 2 to 50 kiloelectron-volts. However, it is generally preferred that polysilicon 106 be doped during a later process step when a dopant is introduced into substrate 102.

Polysilicon 106 includes first portion 110, gate electrode portion 112, and second portion 114. As is seen, first portion 110 and second portion 114 are adjacent to opposite ends of gate electrode portion 112. Boundary 116 (shown as broken lines) is located between first portion 110 and gate electrode portion 112, and boundary 118 (shown as broken lines) is located between gate electrode portion 112 and second portion 114. First portion 110 and second portion 114 each have a length of 3000 angstroms, whereas gate electrode portion 112 has a length of merely 1000 angstroms. First portion 110 and second portion 114 shall be removed, as described below, so that gate electrode portion 112 provides an extremely narrow gate electrode for an N-channel MOSFET.

Photoresist mask 120 is disposed on polysilicon 106. Photoresist mask 120 is deposited as a continuous layer and irradiated using a photolithographic system, such as a step and repeat optical projection system, in which I-line ultraviolet light from a mercury-vapor lamp is projected through a reticle and a focusing lens to obtain the desired image pattern on photoresist mask 120. Thereafter, photoresist mask 120 is developed and the irradiated portions are removed to provide openings. The minimum resolution (i.e. linewidth and spacing) of the step and repeat system is 4000 angstroms (0.4 microns). As a result, photoresist mask 120 has a linewidth of 4000 angstroms that covers gate electrode portion 112 and second portion 114, and photoresist mask 120 includes opening 122 that exposes first portion 110. Accordingly, edge 124 of photoresist mask 120 defines a first edge, corresponding to boundary 116, for gate electrode portion 112. Photoresist mask 120 also includes edge 126, opposite edge 124, and adjacent to another opening (not shown).

Figure 1B:
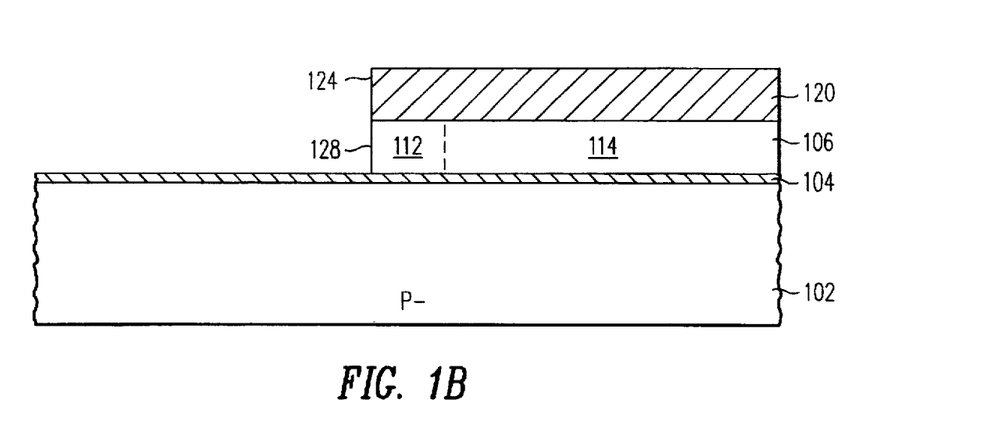

In FIG. 1B, an anisotropic dry etch is applied that is highly selective of polysilicon. Photoresist mask 120 protects gate electrode portion 112 and second portion 114 from the etch, but opening 122 exposes first portion 110 to the etch. As a result, the etch completely removes first portion 110 to form first vertical edge 128 for gate electrode portion 112. First vertical edge 128 is aligned with edge 124 of photoresist mask 120 and corresponds to boundary 116. Although the etch is highly selective of polysilicon, it is non-selective of silicon dioxide, so only a negligible amount of gate oxide 104 beneath first portion 110 is removed and substrate 102 is unaffected.

Figure 1C:
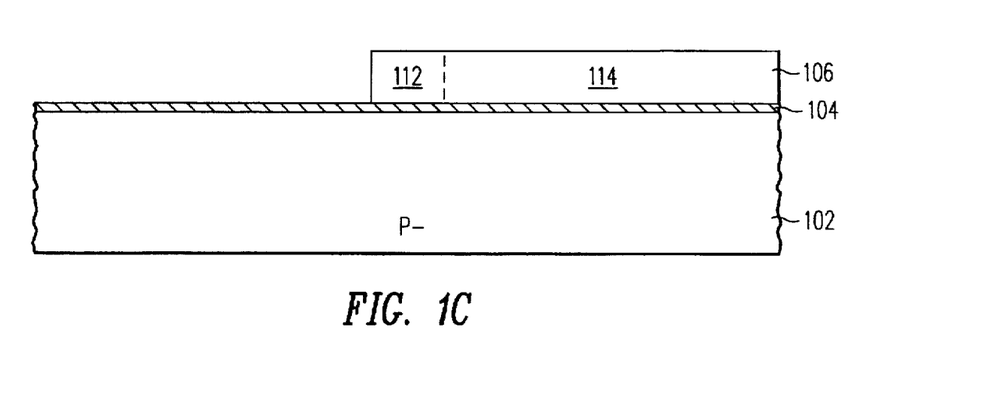

In FIG. 1C, photoresist 120 is stripped, thereby exposing gate electrode portion 112 and second portion 114 of polysilicon 106.

Figure 1D:
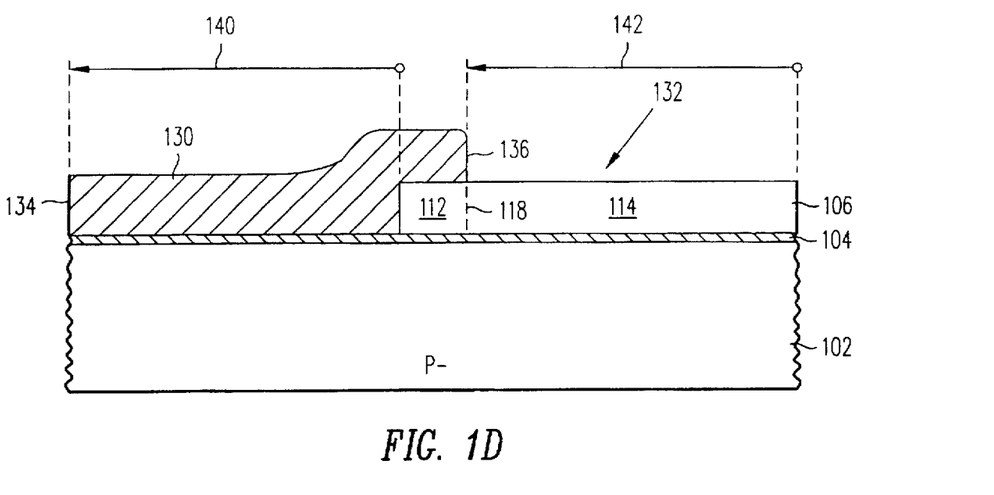

In FIG. 1D, photoresist mask 130 is disposed on polysilicon 106 and gate oxide 104. Photoresist mask 130 is deposited as a continuous layer, irradiated using the step and repeat system, and then the irradiated portions are removed to provide openings. Photoresist mask 130 has a linewidth of 4000 angstroms that covers the gate electrode portion 112 and gate oxide 104 beneath the region previously occupied by first portion 110. Photoresist mask 130 includes opening 132 that exposes second portion 114. Accordingly, edge 136 of photoresist mask 130 defines a second edge, corresponding to boundary 118, for gate electrode portion 112. Photoresist mask 130 also includes edge 134, opposite edge 136, and adjacent to another opening (not shown).

Photoresist mask 130 has an essentially identical configuration (arrangement of openings) with respect to photoresist mask 120, except that photoresist mask 130 is laterally shifted to the left by 3000 angstroms with respect to photoresist mask 120. That is, the image pattern projected by the step and repeat system onto photoresist mask 130 is displaced by 3000 angstroms, in the direction of arrows 140 and 142, with respect to the image pattern projected onto photoresist mask 120. This can be accomplished, for instance, by projecting radiation through a reticle to form a first image pattern on photoresist mask 120, laterally shifting the reticle by 3000 angstroms with respect to substrate 102, and then projecting radiation through the reticle to form a second image pattern on photoresist mask 130. Alternatively, the masks can be patterned by projecting radiation through a first reticle to form a first image pattern on photoresist mask 120, and projecting radiation through a second reticle to form a second image pattern on photoresist mask 130, wherein the second reticle has features shifted by 3000 angstroms with respect to the first reticle. In either case, the first and second image patterns projected onto photoresist masks 120 and 130, respectively, are essentially identical to one another and laterally shifted with respect to one another.

Arrow 140 depicts the lateral shift of edge 134 of photoresist mask 130 with respect to edge 124 of photoresist mask 120, and arrow 142 depicts the lateral shift of edge 136 of photoresist mask 130 with respect to edge 126 of photoresist mask 120. Accordingly, arrow 140 extends across the 3000 angstrom length of the region previously occupied by first portion 110, and arrow 142 extends across the 3000 angstrom length of second portion 114. Of importance, the only region of polysilicon 106 covered by both photoresist mask 120 and photoresist mask 130 (although not simultaneously) is gate electrode portion 112.

Figure 1E:
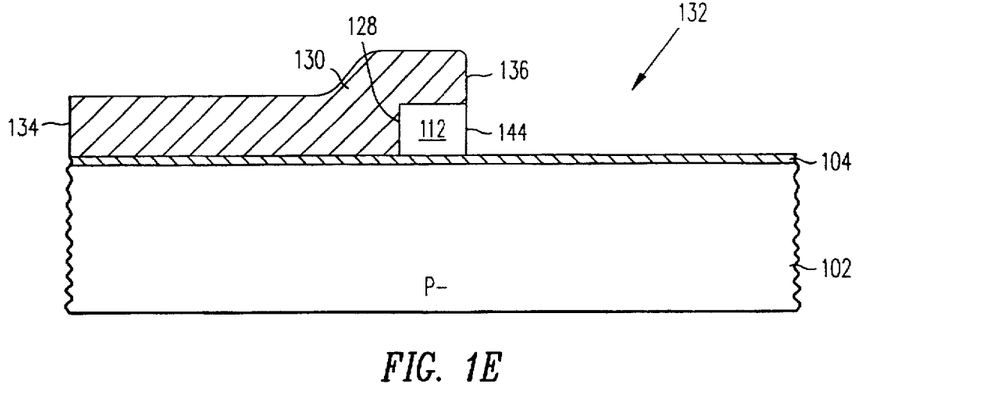

In FIG. 1E, an anisotropic dry etch, similar to the previous dry etch, is applied. Photoresist mask 130 protects gate electrode portion 112 from the etch, but opening 132 exposes second portion 114 to the etch. As a result, the etch completely removes second portion 114 to form second vertical edge 144 for gate electrode portion 112. Second vertical edge 144 is aligned with edge 136 of photoresist mask 130 and corresponds to boundary 118. Advantageously, opposing edges 128 and 144 of gate electrode portion 112 are separated by a length of only 1000 angstroms, which is far narrower than the minimum resolution of the step and repeat system.

Figure 1F:
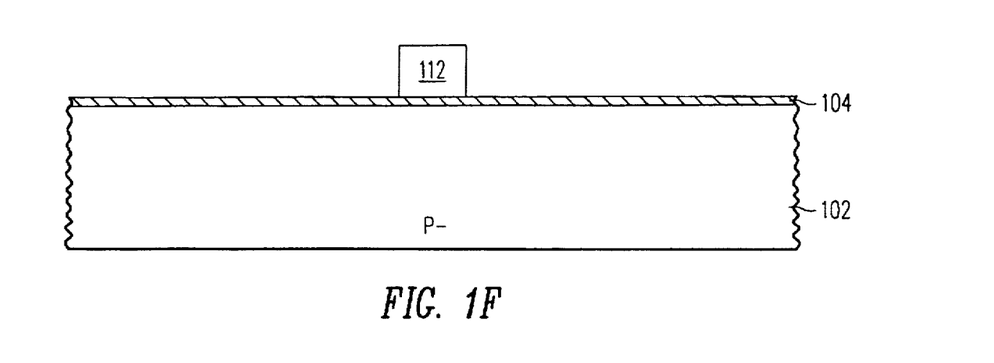

In FIG. 1F, photoresist 130 is stripped, thereby exposing gate electrode portion 112.

Figure 1G:
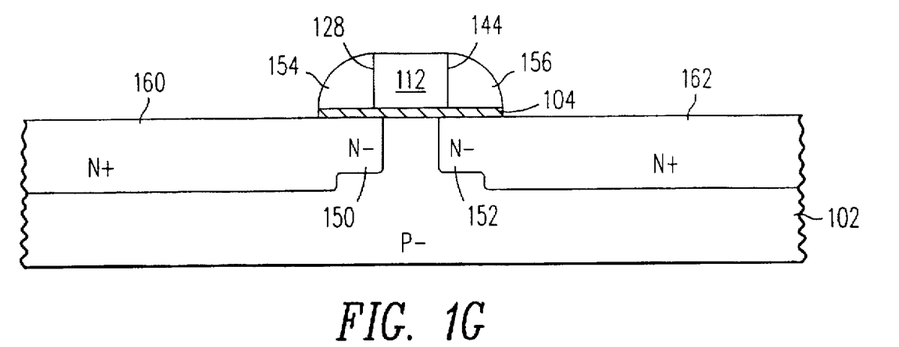

In FIG. 1G, lightly doped source/drain regions 150 and 152 are introduced by subjecting the structure to ion implantation of arsenic, at a dosage in the range of $1\times10^{13}$ to $5\times10^{4}$ atoms/cm$^2$ and an energy in the range of 2 to 50 kiloelectron-volts, using gate electrode portion 112 as an implant mask. Lightly doped source/drain regions 150 and 152 are self-aligned to edges 128 and 144, respectively, and are doped N− with an arsenic concentration in the range of $1\times10^{17}$ to $1\times10^{18}$ atoms/cm$^3$ and a junction depth in the range of 100 to 1500 angstroms. Thereafter, an oxide layer with a thickness in the range of 600 to 2000 angstroms is conformally deposited over the exposed surfaces by CVD at a temperature in the range of 300° to 400° C., and the structure is subjected to a reactive ion etch (RIE) that forms sidewall spacers 154 and 156 adjacent to edges 128 and 144, respectively, of gate electrode portion 112. The RIE also removes the regions of gate oxide 104 outside gate electrode portion 112 and spacers 154 and 156. Thereafter, heavily doped source/drain regions 160 and 162 are implanted into substrate 102 by subjecting the structure to ion implantation of arsenic, at a dosage in the range of $1\times10^{15}$ to $5\times10^{15}$ atoms/cm$^2$ and an energy in the range of 2 to 50 kiloelectron-volts, using gate electrode portion 112 and spacers 154 and 156 as an implant mask. Heavily doped source/drain regions 160 and 162 are self-aligned to the outside edges of spacers 154 and 156, respectively, and are doped N+ with an arsenic concentration in the range of about $1\times10^{18}$ to $1\times10^{19}$ atoms/cm$^3$ and a junction depth in the range of 200 to 3000 angstroms. Preferably, the junction depth of heavily doped source/drain regions 160 and 162 exceeds that of lightly doped source/drain regions 150 and 152. The heavy dose of arsenic also provides sufficient doping to render gate electrode portion 112 conductive. Finally, the structure is annealed to remove crystalline damage and to activate and drive-in the implanted arsenic by applying a rapid thermal anneal on the order of 950° to 1050° C. for 10 to 60 seconds. The implanted arsenic in substrate 102 diffuses both laterally and vertically. As a result, source regions 150 and 160 merge to provide a source, and drain regions 152 and 162 merge to provide a drain for an N-channel MOSFET for which gate electrode portion 112 provides the gate electrode.

FIGS. 2A-2H show cross-sectional views of successive process steps for forming a gate electrode for an IGFET in accordance with a second embodiment of the invention.

Although the first and second masks define the first and second edges of the gate electrode, it is not essential that the gate electrode material be etched through openings in the first and second masks. Likewise, it is not essential that the first and second edges be formed in sequence. The primary difference between the second embodiment and the first embodiment is that in the second embodiment, a masking material is formed on the gate electrode material, the first and second masks are used during sequential etch steps to pattern the masking material, and the patterned masking material is used during a single etch step to simultaneously form the first and second edges of the gate electrode. Unless otherwise noted, the elements for the second embodiment (substrate 202, gate oxide 204, etc.) are similar to elements of the first embodiment (substrate 102, gate oxide 104, etc.), and the description of related elements and process steps need not be repeated.

Figure 2A:
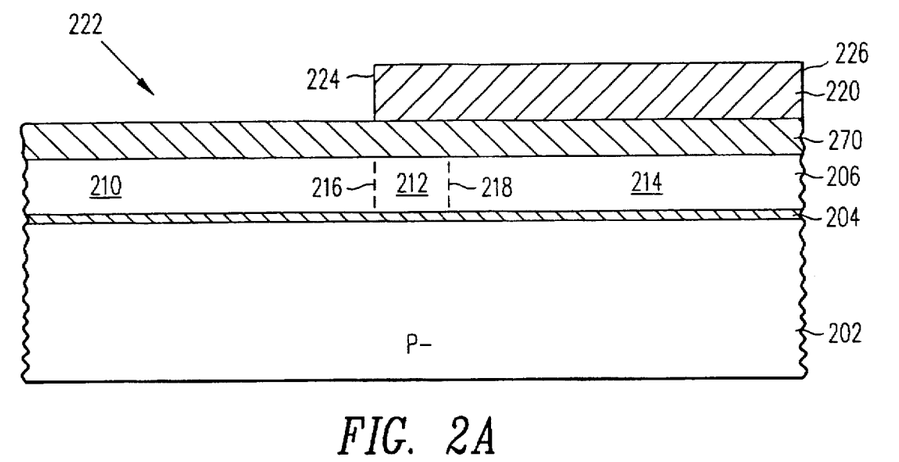
FIGS. 2A–2H show cross-sectional views of successive process steps for forming a gate electrode for an IGFET in accordance with a second embodiment of the invention.

In FIG. 2A, gate oxide 204 is formed on substrate 202, and polysilicon 206 is formed on gate oxide 204. Polysilicon 206 includes first portion 210 adjacent to gate electrode portion 212 at boundary 216, and second portion 214 adjacent to gate electrode portion 212 at boundary 218. First and second portions 210 and 214 each have a length of 3000 angstroms, whereas gate electrode portion 212 has a length of merely 1000 angstroms. A blanket layer of masking oxide 270, composed of silicon dioxide, is deposited on the top surface of polysilicon 206 by CVD. Masking oxide 270 has a thickness of 2000 angstroms. Thereafter, photoresist mask 220 is disposed on masking oxide 270, and patterned to include opening 222 above first portion 210 while covering gate electrode portion 212 and second portion 214. Accordingly, edge 224 of photoresist mask 220 defines a first edge, corresponding to boundary 216, for gate electrode portion 212.

Figure 2B:
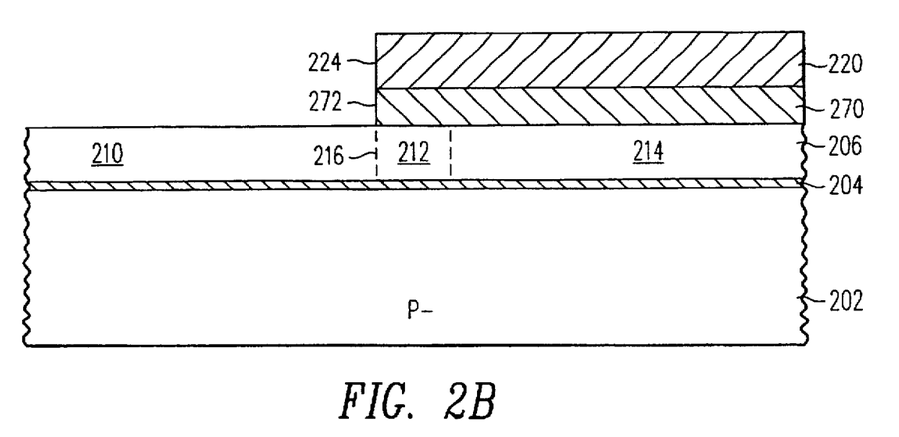

In FIG. 2B, an anisotropic dry etch is applied that is highly selective of silicon dioxide. Photoresist mask 220 protects the portions of masking oxide 270 above gate electrode portion 212 and second portion 214 from the etch, but opening 222 exposes the portion of masking oxide 270 above first portion 210 to the etch. As a result, the etch completely removes the portion of masking oxide 270 above first portion 210 to form first vertical edge 272 in masking oxide 270. Edge 272 is aligned with edge 224 of photoresist mask 220 and corresponds to boundary 216. Although the etch is highly selective of silicon dioxide, it is non-selective of polysilicon, so only a negligible amount of first portion 210 is removed, and gate oxide 204 and substrate 202 are unaffected.

Figure 2C:
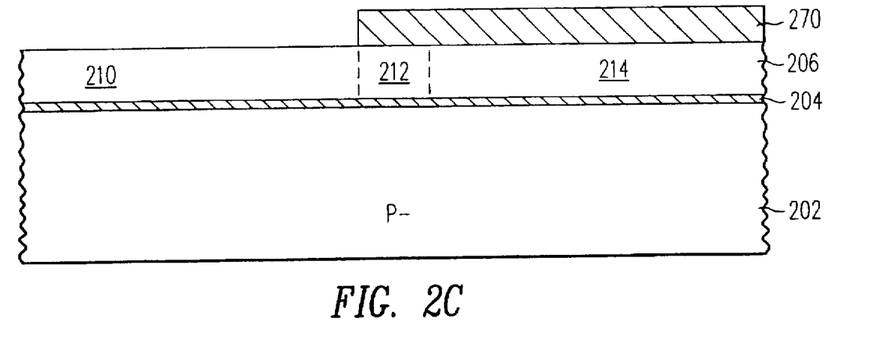

In FIG. 2C, photoresist 220 is stripped, thereby exposing masking oxide 270 above gate electrode portion 212 and second portion 214 of polysilicon 206.

Figure 2D:
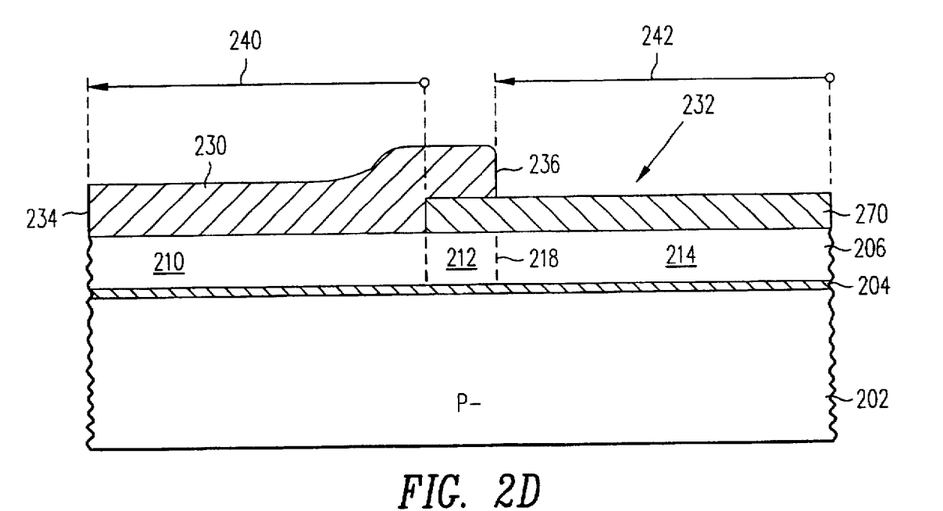

In FIG. 2D, photoresist mask 230 is disposed on portion 210 and on the region of masking oxide 270 above gate electrode portion 212. Photoresist mask 230 includes opening 232 that exposes the region of masking oxide 270 above second portion 214. Accordingly, edge 236 of photoresist mask 230 defines a second edge, corresponding to boundary 218, for gate electrode portion 212. Photoresist mask 230 is laterally shifted to the left by 3000 angstroms with respect to photoresist mask 220. Arrow 240 depicts the lateral shift of edge 234 of photoresist mask 230 with respect to edge 224 of photoresist mask 220, and arrow 242 depicts the lateral shift of edge 236 of photoresist mask 230 with respect to edge 226 of photoresist mask 220. Accordingly, arrow 240 extends across the 3000 angstrom length of first portion 210, and arrow 242 extends across the 3000 angstrom length of second portion 214. Accordingly, the only region of polysilicon 206 covered by both photoresist mask 220 and photoresist mask 230 (although not simultaneously) is gate electrode portion 212.

Figure 2E:
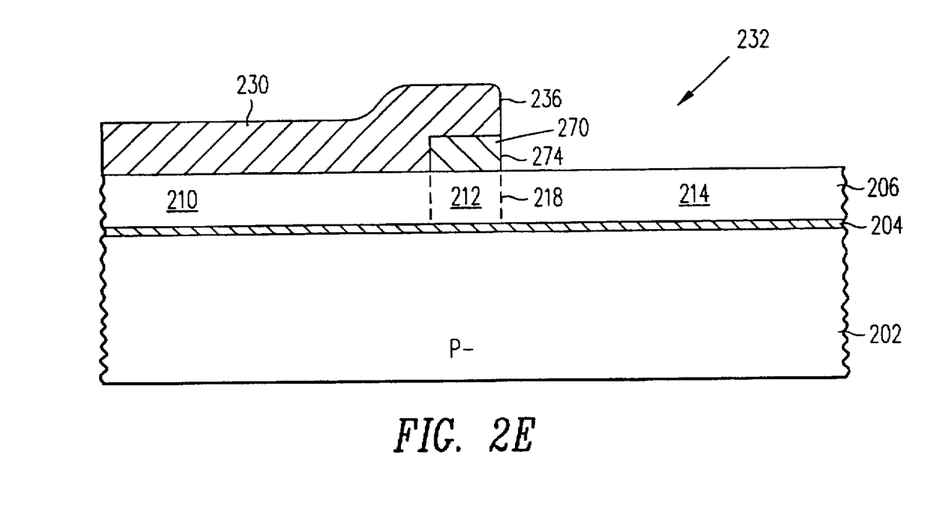

In FIG. 2E, an anisotropic dry etch, similar to the previous etch using photoresist mask 220, is applied. Photoresist mask 230 protects the region of masking oxide 270 above gate electrode portion 212 from the etch, but opening 232 exposes the region of masking oxide 270 above second portion 214 to the etch. As a result, the etch completely removes the region of masking oxide 270 above second portion 214 to form second vertical edge 274 in masking material 270. Edge 274 is aligned with edge 236 of photoresist mask 230 and corresponds to boundary 218.

Figure 2F:
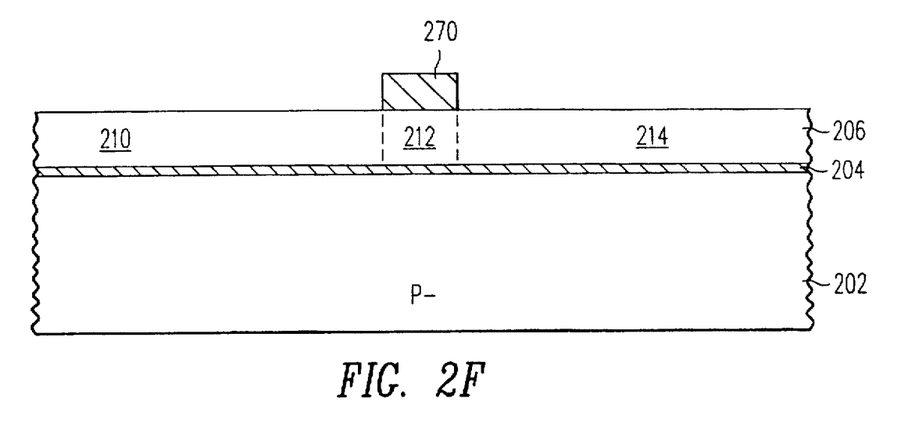

In FIG. 2F, photoresist 230 is stripped, thereby exposing the remaining region of masking material 270 above gate electrode portion 212. At this point, first portion 210 and second portion 214 are exposed. If desired, the length between edges 272 and 274 can be further reduced by applying an isotropic wet etch.

Figure 2G:
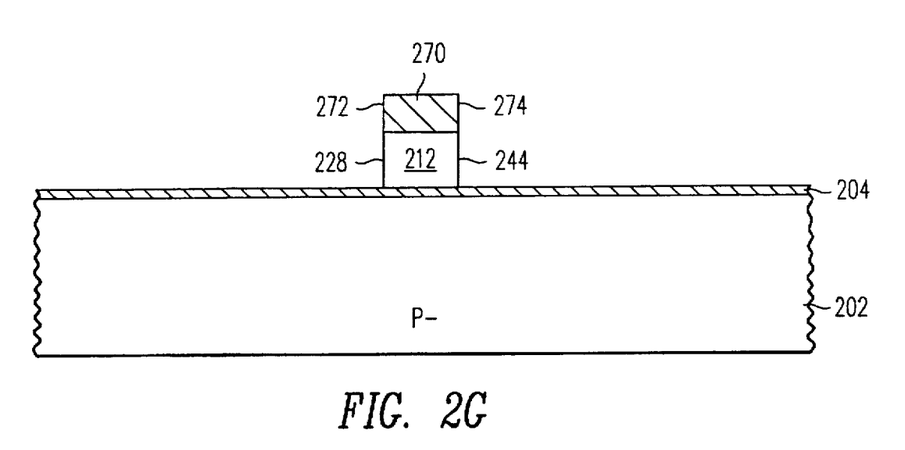

In FIG. 2G, an anisotropic dry etch is applied that is highly selective of polysilicon. Masking material 270 protects gate electrode portion 212 from the etch, however first portion 210 and second portion 214 are exposed to the etch. As a result, the etch completely removes first portion 210 to form first vertical edge 228 of gate electrode portion 212, and completely removes second portion 214 to form second vertical edge 244 of gate electrode portion 212. First vertical edge 228 is aligned with edge 272 of masking material 270 and corresponds to boundary 216, whereas second vertical edge 244 is aligned with edge 274 of masking material 270 and corresponds to boundary 218. Although the etch is highly selective of polysilicon, it is non-selective of silicon dioxide, so only a negligible amount of gate oxide 204 beneath portions 210 and 214 is removed and substrate 202 is unaffected. Advantageously, edges 228 and 244 are separated by a length of only 1000 angstroms, which is far narrower than the minimum resolution of the step and repeat system.

Figure 2H:
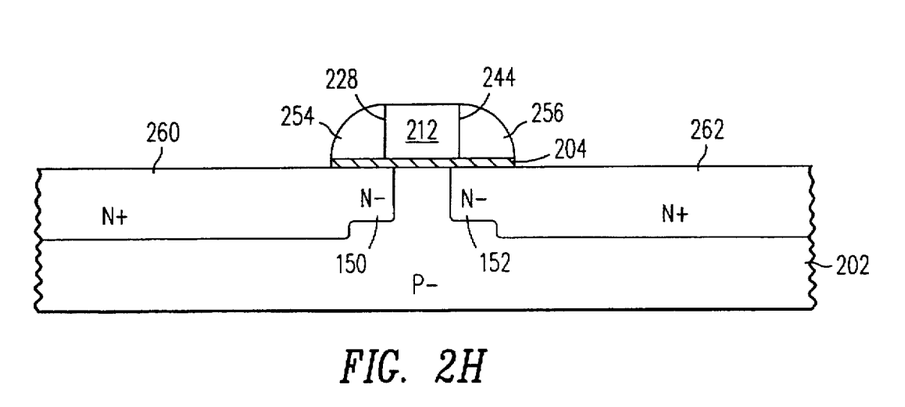

In FIG. 2H, lightly doped source/drain regions 250 and 252 are introduced, spacers 254 and 256 are formed, heavily doped source/drain regions 260 and 262 are introduced, and the structure is annealed. As a result, source regions 250 and 260 merge to provide a source, and drain regions 252 and 262 merge to provide a drain for an N-channel MOSFET for which gate electrode portion 212 provides the gate electrode.

Further processing steps in the fabrication of IGFETs typically include forming a thick oxide layer over the active regions, forming contact windows in the oxide layer to expose the gate electrode, source and drain, forming appropriate interconnect metallization in the contact windows, and forming a passivation layer over the interconnect metallization. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiments described above. For instance, the gate electrode can be various conductors, the gate insulator can be various dielectrics, and the masking material (e.g., masking oxide 270) can be various materials that provide a hard mask. Preferably, the gate electrode has a length in the range of 500 to 1000 angstroms. Lightly doped regions can be included or omitted for the source, the drain, or both. Furthermore, the source and drain can be doped, symmetrically or asymmetrically, at various processing steps. See, for instance, U.S. application Ser. No. 08/682,238 filed Jul. 17, 1996 entitled "Method for Fabrication of a Non-Symmetrical Transistor" by Gardner et al., and U.S. application Ser. No. 08/682,493 filed Jul. 17, 1996 entitled "Method for Fabrication of a Non-Symmetrical Transistor" by Gardner et al., which are incorporated herein by reference.

The invention is particularly well-suited for fabricating N-channel MOSFETs, P-channel MOSFETs, CMOS devices and other types of IGFETs, particularly for high-performance microprocessors where high circuit density is essential. Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming a gate electrode for an IGFET prior to introducing any source/drain doping for the IGFET, comprising the steps of:

forming a gate material for providing a gate electrode over a semiconductor substrate;

forming a first mask over the gate material, wherein the first mask includes an opening that determines a first edge of the gate electrode;

removing a first portion of the gate material to form the first edge of the gate electrode as determined by the first mask;

forming a second mask over the gate material after removing the first mask, wherein the second mask includes an opening that determines a second edge of the gate electrode;

removing a second portion of the gate material to form the second edge of the gate electrode as determined by the second mask; and removing the second mask.

2. The method of claim 1, including removing the first portion of the gate material before removing the second portion of the gate material.

3. The method of claim 1, including removing the first and second portions of the gate material simultaneously.

4. The method of claim 1, including:

forming the first mask on the gate material and etching the first portion of the gate material through the opening in the first mask; and forming the second mask on the gate material and etching the second portion of the gate material through the opening in the second mask.

5. The method of claim 1, including:

forming a masking material for providing a hard mask on the gate material;

forming the first mask on the masking material;

etching a first portion of the masking material through the opening in the first mask to form a first edge of the hard mask;

forming the second mask on the masking material;

etching a second portion of the masking material through the opening in the second mask to form a second edge of the hard mask; and etching the gate material using the hard mask as an etch mask to form the first and second edges of the gate electrode after removing the first and second masks.

6. The method of claim 1, including forming a source and a drain in the substrate using the gate electrode as an implant mask.

7. The method of claim 1, wherein the first and second masks are photoresist and the gate material is polysilicon.

8. The method of claim 1, wherein:

the first mask covers the gate electrode and the second portion of the gate material while the opening in the first mask exposes the first portion of the gate material; and the second mask covers the gate electrode and a region previously occupied by the first portion of the gate material while the opening in the second mask exposes the second portion of the gate material.

9. The method of claim 1, wherein:

forming the first mask includes depositing a first photoresist layer over the substrate and projecting radiation through a reticle to form a first image pattern on the first photoresist layer;

forming the second mask includes depositing a second photoresist layer over the substrate and projecting radiation through the reticle to form a second image pattern on the second photoresist layer, wherein the second image pattern is essentially identical to and laterally shifted with respect to the first image pattern.

10. The method of claim 1, wherein:

forming the first mask includes depositing a first photoresist layer over the substrate and projecting radiation through a first reticle to form a first image pattern on the first photoresist layer; and forming the second mask includes depositing a second photoresist layer over the substrate and projecting radiation through a second reticle to form a second image pattern on the second photoresist layer, wherein the second image pattern is essentially identical to and laterally shifted with respect to the first image pattern.

11. The method of claim 1, including using the IGFET in an integrated circuit chip.

12. The method of claim 1, including using the IGFET in an electronic system that includes a microprocessor, a memory and a system bus.

13. A method of forming a gate electrode for an IGFET prior to introducing any source/drain doping for the IGFET, comprising the steps of:

forming a gate insulator on a semiconductor substrate;

forming a gate material on the gate insulator;

forming a first photoresist mask on the gate material, wherein the first photoresist mask includes an opening that defines a first edge of a gate electrode, with the gate electrode being a portion of the gate material;

etching a first portion of the gate material through the opening in the first photoresist mask to form the first edge of the gate electrode;

forming a second photoresist mask on the gate material after removing the first photoresist mask from the gate material, wherein the second photoresist mask includes an opening that defines a second edge of the gate electrode;

etching a second portion of the gate material through the opening in the second photoresist mask to form the second edge of the gate electrode; and removing the second photoresist mask from the gate electrode.

14. The method of claim 13, including forming a source and a drain in the substrate using the gate electrode as an implant mask.

15. The method of claim 13, wherein the gate material is polysilicon and the gate insulator is silicon dioxide.

16. The method of claim 13, wherein a maximum length between the first and second edges of the gate electrode is less than a minimum resolution of a photolithographic system that patterns the first and second photoresist masks.

17. The method of claim 13, wherein a maximum length between the first and second edges of the gate electrode is less than about 0.1 microns.

18. The method of claim 13, wherein:

the first photoresist mask covers the gate electrode and the second portion of the gate material while the opening in the first photoresist mask exposes the first portion of the gate material; and the second photoresist mask covers the gate electrode and a region previously occupied by the first portion of the gate material while the opening in the second photoresist mask exposes the second portion of the gate material.

19. The method of claim 13, wherein the first and second photoresist masks have essentially identical configurations that are laterally shifted with respect to one another.

20. The method of claim 19, wherein:

forming the first photoresist mask includes depositing a first photoresist layer over the substrate and projecting radiation through a reticle to form a first image pattern on the first photoresist layer; and forming the second photoresist mask includes depositing a second photoresist layer over the substrate and projecting radiation through the reticle to form a second image pattern on the second photoresist layer, wherein the second image pattern is essentially identical to and laterally shifted with respect to the first image pattern.

21. The method of claim 19, wherein:

forming the first photoresist mask includes depositing a first photoresist layer over the substrate and projecting radiation through a first reticle to form a first image pattern on the first photoresist layer; and forming the second photoresist mask includes depositing a second photoresist layer over the substrate and projecting radiation through a second reticle to form a second image pattern on the second photoresist layer, wherein the second image pattern is essentially identical to and laterally shifted with respect to the first image pattern.

22. A method of forming a gate electrode for an IGFET, comprising the steps of:

forming a gate insulator on a semiconductor substrate;

forming a gate material on the gate insulator;

forming a masking material on the gate material;

forming a first photoresist mask on the masking material, wherein the first photoresist mask includes an opening that defines a first edge of a gate electrode, with the gate electrode being a portion of the gate material;

etching a first portion of the masking material through the opening in the first photoresist mask to form a first edge of a masking region, with the masking region being a portion of the masking material;

forming a second photoresist mask on the masking material after removing the first photoresist mask from the masking material, wherein the second photoresist mask includes an opening that defines a second edge of the gate electrode;

etching a second portion of the masking material through the opening in the second photoresist mask to form a second edge of the masking region;

removing the second photoresist mask from the masking region; and etching the gate material using the masking region as an etch mask to form the first and second edges of the gate electrode after removing the first and second masks.

23. The method of claim 22, including forming a source and a drain in the substrate using the gate electrode as an implant mask.

24. The method of claim 22, wherein the gate material is polysilicon and the gate insulator is silicon dioxide.

25. The method of claim 22, wherein a maximum length between the first and second edges of the gate electrode is less than a minimum resolution of a photolithographic system that patterns the first and second photoresist masks.

26. The method of claim 22, wherein a maximum length between the first and second edges of the gate electrode is less than about 0.1 microns.

27. The method of claim 22, wherein:

the first photoresist mask covers the gate electrode and the second portion of the gate material while the opening in the first photoresist mask exposes the first portion of the masking material; and the second photoresist mask covers the gate electrode and the first portion of the gate material while the opening in the second photoresist mask exposes the second portion of the masking material.

28. The method of claim 22, wherein the first and second photoresist masks have essentially identical configurations that are laterally shifted with respect to one another.

29. The method of claim 28, wherein:

forming the first photoresist mask includes depositing a first photoresist layer over the substrate and projecting radiation through a reticle to form a first image pattern on the first photoresist layer; and forming the second mask includes depositing a second photoresist layer over the substrate and projecting radiation through the reticle to form a second image pattern on the second photoresist layer, wherein the second image pattern is essentially identical to and laterally shifted with respect to the first image pattern.

30. The method of claim 28, wherein:

forming the first photoresist mask includes depositing a first photoresist layer over the substrate and projecting radiation through a first reticle to form a first image pattern on the first photoresist layer; and forming the second photoresist mask includes depositing a second photoresist layer over the substrate and projecting radiation through a second reticle to form a second image pattern on the second photoresist layer, wherein the second image pattern is essentially identical to and laterally shifted with respect to the first image pattern.

31. A method of forming a gate electrode for an IGFET prior to introducing any source/drain doping for the IGFET, comprising the following steps in the sequence set forth:

forming a gate oxide on a semiconductor substrate;

forming a polysilicon layer on the gate oxide; wherein the polysilicon layer includes a gate electrode and first and second portions adjacent to opposite ends of the gate electrode;

forming a first photoresist mask on the polysilicon layer, wherein the first photoresist mask includes an opening that defines a first edge of the gate electrode adjacent to the first portion of the polysilicon layer, and the first photoresist mask covers the gate electrode and the second portion of the polysilicon layer;

etching the first portion of the polysilicon layer through the opening in the first photoresist mask to form the first edge of the gate electrode;

removing the first photoresist mask from the polysilicon layer;

forming a second photoresist mask on the polysilicon layer and the gate oxide, wherein the second photoresist mask includes an opening that defines a second edge of the gate electrode adjacent to the second portion of the polysilicon layer, and the second photoresist mask covers the gate electrode and a region of the gate oxide adjacent to the first edge of the gate electrode;

etching the second portion of the polysilicon layer through the opening in the second photoresist mask to form the second edge of the gate electrode; and removing the second photoresist mask from the gate electrode and the region of the gate oxide adjacent to the first edge of the gate electrode.

32. A method of forming a gate electrode for an IGFET, comprising the following steps in the sequence set forth:

forming a gate oxide on a semiconductor substrate;

forming a polysilicon layer on the gate oxide, wherein the polysilicon layer includes a gate electrode and first and second portions adjacent to opposite ends of the gate electrode;

forming an oxide masking layer on the polysilicon layer;

forming a first photoresist mask on the oxide masking layer, wherein the first photoresist mask includes an opening that defines a first edge of the gate electrode adjacent to the first portion of the polysilicon layer, and the first photoresist mask covers the gate electrode and the second portion of the polysilicon layer;

etching a first portion of the oxide masking layer through the opening in the first photoresist mask to form a first edge of an oxide mask, with the oxide mask being a portion of the oxide masking layer;

removing the first photoresist mask from the oxide masking layer;

forming a second photoresist mask on the oxide masking layer and the first portion of the polysilicon layer, wherein the second photoresist mask includes an opening that defines a second edge of the gate electrode adjacent to the second portion of the polysilicon layer, and the second photoresist mask covers the gate electrode and the first portion of the polysilicon layer;

etching a second portion of the oxide masking layer through the opening in the second photoresist mask to form a second edge of the oxide mask;

removing the second photoresist mask from the oxide mask and the first portion of the polysilicon layer; and etching the first and second portions of the polysilicon layer using the oxide mask as an etch mask to simultaneously form the first and second edges of the gate electrode.

33. A method of forming a gate electrode for an IGFET, comprising the steps of:

forming a gate material for providing a gate electrode over a semiconductor substrate;

forming a first mask over the gate material, wherein the first mask includes an opening that defines a first edge of the gate electrode;

forming a second mask over the gate material after removing the first mask, wherein the second mask includes an opening that defines a second edge of the gate electrode;

removing the second mask;

removing a first portion of the gate material to form the first edge of the gate electrode as defined by the first mask; and removing a second portion of the gate material to form the second edge of the gate electrode as defined by the second mask, wherein the first and second portions of the gate material are removed simultaneously.

34. A method of forming a gate electrode for an IGFET, comprising the steps of:

forming a gate material for providing a gate electrode over a semiconductor substrate;

forming a masking material for providing a hard mask on the gate material;

forming a first mask on the masking material and over the gate material, wherein the first mask includes an opening that defines a first edge of the gate electrode;

etching a first portion of the masking material through the opening in the first mask to form a first edge of the hard mask;

forming a second mask on the masking material and over the gate material after removing the first mask, wherein the second mask includes an opening that defines a second edge of the gate electrode;

etching a second portion of the masking material through the opening in the second mask to form a second edge of the hard mask;

removing the second mask;

removing a first portion of the gate material to form the first edge of the gate electrode as defined by the first mask and removing a second portion of the gate material to form the second edge of the gate electrode as defined by the second mask by etching the gate material using the hard mask as an etch mask to form the first and second edges of the gate electrode after removing the first and second masks.

35. A method of forming a gate electrode for an IGFET, comprising the steps of:

forming a gate material for providing a gate electrode over a semiconductor substrate;

forming a first mask over the gate material, wherein forming the first mask includes depositing a first photoresist layer over the substrate and projecting radiation through a reticle to form a first image pattern on the first photoresist layer, and the first mask includes an opening that defines a first edge of the gate electrode;

removing a first portion of the gate material to form the first edge of the gate electrode as defined by the first mask;

forming a second mask over the gate material after removing the first mask, wherein forming the second mask includes depositing a second photoresist layer over the substrate and projecting radiation through the reticle to form a second image pattern on the second photoresist layer, wherein the second image pattern is essentially identical to and laterally shifted with respect to the first image pattern, and the second mask includes an opening that defines a second edge of the gate electrode;

removing a second portion of the gate material to form the second edge of the gate electrode as defined by the second mask; and removing the second mask.

36. A method of forming a gate electrode for an IGFET, comprising the steps of:

forming a gate material for providing a gate electrode over a semiconductor substrate;

forming a first mask over the gate material, wherein forming the first mask includes depositing a first photoresist layer over the substrate and projecting radiation through a first reticle to form a first image pattern on the first photoresist layer, and the first mask includes an opening that defines a first edge of the gate electrode;

removing a first portion of the gate material to form the first edge of the gate electrode as defined by the first mask;

forming a second mask over the gate material after removing the first mask, wherein forming the second mask includes depositing a second photoresist layer over the substrate and projecting radiation through a second reticle to form a second image pattern on the second photoresist layer, the second image pattern is essentially identical to and laterally shifted with respect to the first image pattern, and the second mask includes an opening that defines a second edge of the gate electrode;

removing a second portion of the gate material to form the second edge of the gate electrode as defined by the second mask; and removing the second mask.

37. A method of forming a gate electrode for an IGFET, comprising the steps of:

forming a gate insulator on a semiconductor substrate;

forming a gate material on the gate insulator;

forming a first photoresist mask on the gate material, wherein the first photoresist mask includes an opening that defines a first edge of a gate electrode, with the gate electrode being a portion of the gate material;

etching a first portion of the gate material through the opening in the first photoresist mask to form the first edge of the gate electrode;

forming a second photoresist mask on the gate material after removing the first photoresist mask from the gate material, wherein the first and second photoresist masks have essentially identical configurations that are laterally shifted with respect to one another, and the second photoresist mask includes an opening that defines a second edge of the gate electrode;

etching a second portion of the gate material through the opening in the second photoresist mask to form the second edge of the gate electrode; and removing the second photoresist mask from the gate electrode.

38. The method of claim 37, wherein:

forming the first photoresist mask includes depositing a first photoresist layer over the substrate and projecting radiation through a reticle to form a first image pattern on the first photoresist layer; and forming the second photoresist mask includes depositing a second photoresist layer over the substrate and projecting radiation through the reticle to form a second image pattern on the second photoresist layer, wherein the second image pattern is essentially identical to and laterally shifted with respect to the first image pattern.

39. The method of claim 37, wherein:

forming the first photoresist mask includes depositing a first photoresist layer over the substrate and projecting radiation through a first reticle to form a first image pattern on the first photoresist layer; and forming the second photoresist mask includes depositing a second photoresist layer over the substrate and projecting radiation through a second reticle to form a second image pattern on the second photoresist layer, wherein the second image pattern is essentially identical to and laterally shifted with respect to the first image pattern.

40. The method of claims 22, 32, 33, 34, 35, 36 or 37, including forming the gate electrode prior to introducing any source/drain doping for the IGFET.

41. The method of claims 13, 22, 31, 32, 33, 34, 35, 36 or 37, wherein the first mask determines the first edge of the gate electrode, and the second mask determines the second edge of the gate electrode.

* * * * *